United States Patent
Poole et al.

[11] Patent Number: 5,225,272
[45] Date of Patent: Jul. 6, 1993

[54] POLYMERIC FILM

[75] Inventors: Neil Poole, Darlington; Thane C. Gough, Guisborough, both of England

[73] Assignee: Imperial Chemical Industries PLC, London, England

[21] Appl. No.: 865,670

[22] Filed: Apr. 8, 1992

Related U.S. Application Data

[63] Continuation of Ser. No. 451,328, Dec. 19, 1989, abandoned.

[30] Foreign Application Priority Data

Dec. 19, 1988 [GB] United Kingdom ............ 8829557.1

[51] Int. Cl.$^5$ .................. B32B 5/16; B32B 15/08; B32B 31/12
[52] U.S. Cl. .................. 428/323; 156/229; 264/291; 428/458; 428/463
[58] Field of Search ........... 428/457, 458, 480, 463, 428/323; 264/291; 156/229

[56] References Cited

U.S. PATENT DOCUMENTS

| | | | |
|---|---|---|---|
| 4,008,203 | 2/1977 | Jones | 428/457 |
| 4,109,052 | 8/1978 | Anderson | 428/409 |
| 4,391,767 | 7/1983 | Pears | 264/210.3 |
| 4,704,325 | 11/1987 | Crocker | 428/458 |
| 4,945,008 | 7/1990 | Heyes et al. | 428/458 |

FOREIGN PATENT DOCUMENTS

| | | |
|---|---|---|
| 0001879 | 5/1979 | European Pat. Off. . |
| 0184458 | 6/1986 | European Pat. Off. . |
| 0357196 | 3/1990 | European Pat. Off. . |
| 360386 | 3/1990 | European Pat. Off. . |
| 54-120098 | 9/1979 | Japan . |
| 59-109357 | 6/1984 | Japan . |
| 1238039 | 7/1971 | United Kingdom . |
| 1509791 | 5/1978 | United Kingdom . |

*Primary Examiner*—Thomas J. Herbert, Jr.
*Attorney, Agent, or Firm*—Cushman, Darby & Cushman

[57] ABSTRACT

A metallized film comprises a substrate layer of a synthetic polymeric material having on at least one surface thereof an adherent layer and a metallic layer on the surface of the at least one adherent layer remote from the substrate, the adherent layer comprising an acrylic and/or methacrylic polymer containing at least one monomer having a free carboxylic group, wherein the carboxylic group content of the polymer is greater than 6 mole %.

10 Claims, 1 Drawing Sheet

POLYMERIC FILM

This is a continuation of application No. 07/451,328, filed on Dec. 19, 1989, now abandoned.

This invention relates to a metallised film and, in particular, to a metallised film comprising a primed polymeric substrate.

Metallic foils, such as aluminium foil, which hitherto have been employed as packaging materials for snack foods, bakery products, potato crisps, coffee beans etc, are increasingly being replaced by less costly metallised film composite structures comprising a substrate of a polymeric film coated with a thin metallic layer. The polymeric film substrate generally provides a strong, flexible packaging medium offering desirable oxygen and moisture barrier properties, and these characteristics are supplemented by the presence of the metallic layer which additionally provides a barrier to visible and ultra-violet light thereby delaying the onset of oxidative degradation to which certain packaged products are vulnerable.

To promote adhesion between a polymeric film and a subsequently deposited metallic layer it is advantageous to employ an intermediate priming layer. Even so, available metallised films are prone to rupture by failure of the adhesive bond between the substrate and metallic layer, particularly if a film package is exposed to impacts, or otherwise mishandled—for example, by being accidentally dropped onto a relatively solid surface. Presently available metallised films are particularly prone to rupture under humid conditions, which causes problems when the films are used as containers for liquids eg wines, beers, or for materials containing water eg tomato puree and other fruit concentrates.

We have now devised a metallised film exhibiting improved adhesion between the substrate and metallic layer, especially under humid conditions.

Accordingly, the present invention provides a metallised film comprising a substrate layer of a synthetic polymeric material having on at least one surface thereof an adherent layer and a metallic layer on the surface of the at least one adherent layer remote from the substrate, wherein the adherent layer comprises an acrylic and/or methacrylic polymer comprising at least one monomer containing a free carboxylic group, wherein the carboxylic group content of the polymer is greater than 6 mole %.

The invention also provides a method of producing a metallised film by forming a substrate layer of a synthetic polymeric material, applying to at least one surface thereof an adherent layer, and depositing a metallic layer on the surface of the at least one adherent layer remote from the substrate, wherein the adherent layer comprises an acrylic and/or methacrylic polymer comprising at least one monomer containing a free carboxylic group, wherein the carboxylic group content of the polymer is greater than 6 mole %.

The acrylic or methacrylic polymer which forms the adherent layer contains free carboxylic groups, that is carboxylic groups other than those involved in the polymerisation reaction by which the polymer is formed. By free carboxylic group is meant a group of formula—$CO_2R$, wherein R is hydrogen, ammonium, substituted ammonium, or an alkali metal, such as lithium, sodium or potassium. Ethylenically unsaturated monomers can be employed to provide the free carboxylic groups of the polymer. For example acrylic acid, methacrylic acid, maleic acid, itaconic acid, and derivatives thereof can be used. Such polymers may contain other ethylenically unsaturated monomers which do not contain free functional acid groups.

The adherent polymer should contain greater than 6 mole %, and preferably less than 35 mole % of free carboxylic groups. The polymer preferably contains 8 to 30 mole %, and more preferably 10 to 20 mole % of free carboxylic groups.

The adherent polymer preferably comprises an acrylate or methacrylate component, from 50 mole % up to, but not including, 94 mole %.

The acrylate or methacrylate component preferably comprises an ester of acrylic acid or methacrylic acid, especially an alkyl ester where the alkyl group contains up to ten carbon atoms such as methyl, ethyl, n-propyl, isopropyl, n-butyl, isobutyl, terbutyl, hexyl, 2-ethylhexyl, heptyl, and n-octyl. Polymers derived from an alkyl acrylate, for example ethyl acrylate and butyl acrylate, together with an alkyl methacrylate provide particularly effective adhesion between the polymeric film substrate and metallised layer. Polymers comprising butyl acrylate and methyl methacrylate are particularly preferred. The acrylate monomer is preferably present in a proportion in the range 30 to 55 mole %, and the methacrylate monomer is preferably present in a proportion in the range of 20 to 45 mole %.

Other monomers which are suitable for use in the preparation of the adherent polymer are preferably copolymerised as optional additional monomers together with esters of acrylic acid and/or methacrylic acid, and derivatives thereof, include acrylonitrile, methacrylonitrile, halo-substituted acrylonitrile, halo-substituted methacrylonitrile. acrylamide, methacrylamide, N-methylol acrylamide, N-ethanol acrylamide, N-propanol acrylamide, N-methylol methacrylamide, N-ethanol methacrylamide, N-methyl acrylamide, N-tertiary butyl acrylamide, hydroxyethyl methacrylate, glycidyl acrylate, glycidyl methacrylate, dimethylamino ethyl methacrylate, itaconic anhydride and half esters of itaconic acid.

Other optional monomers include vinyl esters such as vinyl acetate, vinyl chloroacetate and vinyl benzoate, vinyl pyridine, vinyl chloride, vinylidene chloride, maleic anhydride, butadiene, styrene and derivatives of styrene such as chloro styrene, hydroxy styrene and alkylated styrenes, wherein the alkyl group contains from one to ten carbon atoms.

A preferred adherent polymer derived from 4 monomers comprises 30 to 40 mole % of methyl methacrylate/30 to 45 mole % of butyl acrylate/5 to 15 mole % of styrene/10 to 20 mole % of (acrylic acid and/or methacrylic acid).

Conventional additives may be included in the adherent layer eg adhesion promoters and particulate fillers for providing slip properties.

If desired, the adherent composition may also contain a cross-linking agent which functions to cross-link the adherent polymer thereby improving adhesion to the polymeric film substrate. Additionally, the cross-linking agent should preferably be capable of internal cross-linking in order to provide protection against solvent penetration. Suitable cross-linking agents may comprise epoxy resins, alkyd resins, amine derivatives such as hexamethoxymethyl melamine, and/or condensation products of an amine, eg melamine, diazine, urea, cyclic ethylene urea, cyclic propylene urea, thiourea, cyclic ethylene thiourea, alkyl melamines, aryl melamines, benzo guanamines, guanamines, alkyl guanamines and aryl guanamines, with an aldehyde, eg formaldehyde. A useful condensation product is that of melamine with formaldehyde. The condensation product may optionally be alkoxylated. The cross-linking agent may be used in amounts of up to 25% by weight based on the weight of the polymer in the adherent composition. A catalyst is also preferably employed to facilitate the cross-linking action of the cross-linking agent. Preferred catalysts for cross-linking melamine formaldehyde include ammonium chloride, ammonium nitrate, ammonium thiocyanate, ammonium dihydrogen phosphate, ammonium sulphate, diammonium hydrogen phosphate, para toluene sulphonic acid, maleic acid stabilised by reaction with a base, and morpholinium para toluene sulphonate.

The copolymers of the adherent composition are generally water-insoluble. If the adherent composition includes a water-insoluble polymer it may nevertheless be applied to the polymeric film substrate as an aqueous dispersion, or alternatively as a solution in an organic solvent.

The substrate of a metallised film according to the invention may be formed from any synthetic, film-forming polymeric material. Suitable thermoplastics materials include a homopolymer or copolymer of a 1-olefin, such as ethylene, propylene and but-1-ene, a polyamide, a polycarbonate, and, particularly, a synthetic linear polyester which may be obtained by condensing one or more dicarboxylic acids or their lower alkyl (up to 6 carbon atoms) diesters, eg therephthalic acid, isophthalic acid, phthalic acid, 2,5- 2,6- or 2,7-naphthalenedicarboxylic acid, succinic acid, sebacic acid, adipic acid, azelaic acid, 4,4'-diphenyldicarboxylic acid, hexahydroterephthalic acid or 1,2-bis-p-carboxyphenoxyethane (optionally with a monocarboxylic acid, such as pivalic acid) with one or more glycols, particularly aliphatic glycols, eg ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example—as described in British patent 838708.

The substrate may also comprise a polyarylether or thio analogue thereof, particularly a polyaryletherketone, polyarylethersulphone, polyaryletheretherketone, polyaryletherethersulphone, or a copolymer or thioanalogue thereof. Examples of these polymers are disclosed in EP-A-1879, EP-A-184458 and US-A-4008203, particular suitable materials being those sold by ICI Chemicals and Polymers Ltd under the Registered Trade Mark STABAR. Blends of these polymers may also be employed.

Suitable thermoset resin substrate materials include addition—polymerisation resins—such as acrylics, vinyls, bis-maleimides and unsaturated polyesters, formaldehyde condensate resins—such as condensates with urea, melamine or phenols, cyanate resins, isocyanate resins, epoxy resins, functionalised polyesters, polyamides or polyimides.

A polymeric film substrate for production of a metallised film according to the invention may be unoriented, or uniaxially oriented, but is preferably biaxially oriented by drawing in two mutually perpendicular directions in the plane of the film to achieve a satisfactory combination of mechanical and physical properties. Simultaneous biaxial orientation may be effected by extruding a thermoplastics polymeric tube which is subsequently quenched, reheated and then expanded by internal gas pressure to induce transverse orientation, and withdrawn at a rate which will induce longitudinal orientation. In such a simultaneous stretching process, the adherent coating medium is suitably applied to the substrate either before commencement or after conclusion of the stretching operation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, ie the forward direction through the film stretching machine, and then in the transverse direction. A stretched substrate film may be, and preferably is, dimensionally stabilised by heat-setting under dimensional restraint at a temperature above the glass transition temperature thereof.

The adherent coating medium may be applied to an already oriented film substrate. However, application of the coating medium is preferably effected before or during the stretching operation.

In particular, it is preferred that the adherent coating medium should be applied to the film substrate between the two stages (longitudinal and transverse) of a biaxial stretching operation. Such a sequence of stretching and coating is especially preferred for the production of a coated linear polyester film substrate, such as a coated polyethylene terephthalate film, which is preferably firstly stretched in the longitudinal direction over a series of rotating rollers, coated with the adherent layer, and then stretched transversely in a stenter oven, preferably followed by heat setting.

The adherent composition may be applied to the polymeric film substrate as an aqueous dispersion or solution in an organic solvent by any suitable conventional coating technique such as dip coating, bead coating, reverse roller coating or slot coating.

Modification of the surface of the polymeric adherent layer, eg by flame treatment, ion bombardment, electron beam treatment, ultra-violet light treatment or preferably by corona discharge, may improve the adhesion of the metallic layer applied directly to the polymeric layer but may not be essential to the provision of satisfactory adhesion.

The preferred treatment by corona discharge may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface.

Satisfactory adhesion of a metallic layer applied directly to the surface of some adherent layers can however be achieved without any prior surface modification, eg by corona discharge treatment.

An adherent composition applied to the polymeric film surface is preferably applied as an aqueous dispersion. The temperatures encountered by the coated film during the subsequent stretching and/or heat setting are effective in drying the aqueous medium, or the solvent in the case of solvent-applied compositions, and also in coalescing and forming the coating into a continuous and uniform subbing layer. The cross-linking of cross-linkable adherent compositions is also achieved at such stretching and/or heat-setting temperatures.

The adherent layer is preferably applied to the polymeric film at a coat weight within the range 0.1 to 10 mgdm$^{-2}$, especially 0.3 to 2.0 mgdm$^{-2}$. For films coated on both surfaces with an adherent layer, each layer preferably has a coat weight within the preferred range.

Prior to deposition of the adherent layer onto the polymeric substrate the exposed surface thereof may, if desired, be subjected to a chemical or physical surface-modifying treatment to improve the bond between that surface and the subsequently applied adherent layer. A preferred treatment, because of its simplicity and effectiveness, which is particularly suitable for the treatment of a polyolefin substrate, is to subject the exposed surface of the substrate to a high voltage electrical stress accompanied by corona discharge. Alternatively, the substrate may be pretreated with an agent known in the art to have a solvent or swelling action on the substrate polymer. Examples of such agents, which are particularly suitable for the treatment of a polyester substrate, include a halogenated phenol dissolved in a common organic solvent eg a solution of p-chloro-m- cresol, 2,4-dichlorophenol, 2,4,5- or 2,4,6-trichlorophenol or 4-chlororesorcinol in acetone or methanol.

An adherent coating may be applied to one or each surface of the polymeric substrate, and one or each adherent layer may be subsequently metallised. Alternatively, one surface of the substrate may be uncoated, or may be coated with a layer of a material other than the herein specified adherent composition. For example, a pressure sensitive adhesive layer may be deposited on the unmetallised surface of a substrate.

Deposition of a metallic layer onto the, or each, adherent layer may be effected by conventional metallising techniques—for example, by deposition from a suspension of finely-divided metallic particles in a suitable liquid vehicle, or by electron beam evaporation, electroless plating, or preferably by a vacuum deposition process in which a metal is evaporated onto the adherent resin surface in a chamber maintained under conditions of high vacuum. Suitable metals include palladium, titanium, chromium, nickel, copper (and alloys thereof, such as bronze), silver, gold, cobalt and zinc, but aluminium is to be preferred for reasons both of economy and ease of bonding to the resin layer.

Metallising may be effected over the entire exposed surface of the adherent layer or over only selected portions thereof, as desired.

Metallised films in accordance with the present invention may be prepared in a range of thicknesses governed primarily by the ultimate application for which a particular film is to be employed. Films, having a total thickness in a range extending from 2.5 to 250 $\mu$m are of general utility, although for packaging applications a packaging film or from about 10 to 50 $\mu$m in total thickness is generally suitable.

The ratio of substrate to adherent layer thickness may vary within a wide range, although the thickness of the adherent layer preferably should not be less than 0.004% nor greater than 10% of that of the substrate. In practice, the thickness of the adherent layer is desirably 0.01 $\mu$m to 10 $\mu$m, and preferably should not greatly exceed about 1.0 $\mu$m. The metallic layer is conveniently deposited in a thickness from monoatomic proportions to about 50 $\mu$m or greater, although a preferred range is from 0.005 to 15.0 $\mu$m, and particularly from 0.01 to 0.5 $\mu$m.

One or more of the polymeric layers of a metallised film according to the invention may conveniently contain any of the additives conventionally employed in the manufacture of polymeric films. Thus, agents such as dyes, pigments, voiding agents, lubricants, anti-oxidants, anti-blocking agents, surface active agents, slip aids, gloss-improvers, prodegradants, ultra-violet light stabilisers, viscosity modifiers and dispersion stabilisers may be incorporated in the substrate and/or adherent layer(s), as appropriate. In particular an adherent coating layer, and/or a substrate, may comprise a particulate filler, such as silica, of small particle size. Desirably, a filler, if employed in an adherent layer, should be present in an amount of not exceeding 50% by weight of the adherent polymer, and the particle size thereof should not exceed 0.5 $\mu$m, preferably less than 0.3 $\mu$m, and especially from 0.005 to 0.2 $\mu$m. A filler, if employed in a substrate layer, should be present in a small amount, not exceeding 0.5%, preferably less than 0.2%, by weight of the substrate. The haze characteristics, of a polymeric film containing a filler of larger particle size are such that a metallised film prepared therefrom exhibits an undesirable dull appearance.

Application of decorative and/or descriptive matter to the films of the invention may be effected by conventional printing techniques, for example—by printing an inked pattern directly onto the metallic surface of the film and, optionally, protecting the printed matter by a layer of a protective lacquer. Alternatively, reverse printing techniques may be employed whereby the printed matter is embedded in the film at an interlayer position.

Films according to the invention are of utility in a wide range of applications including decorative drapes, reflective screens, mirrors, solar panels, electrical circuit boards, capacitors, magnetic recording media and packaging wraps and pouches. Such films are of particular utility as the internal liner of bag-in-the-box containers for wines, beers and carbonated drinks.

BRIEF DESCRIPTION OF THE DRAWINGS

The invention is illustrated by reference to the accompanying drawings in which:

Referring to FIG. 1 of the drawings, the film comprises a polymeric substrate layer (1) having a metallic layer (2) bonded to one surface (3) thereof by an intermediate adherent layer (4) of a polymer composition according to the invention. Surface (5) of the substrate, remote from metallic layer (2), is uncoated.

Figure 1:
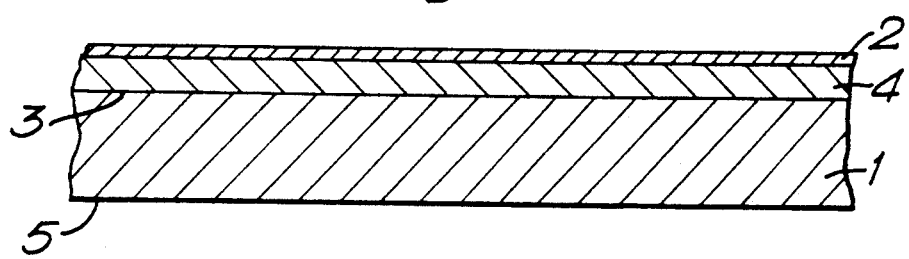
FIG. 1 is a schematic sectional elevation, not to scale, of a polymeric film having a single metallic surface layer.
Figure 2:
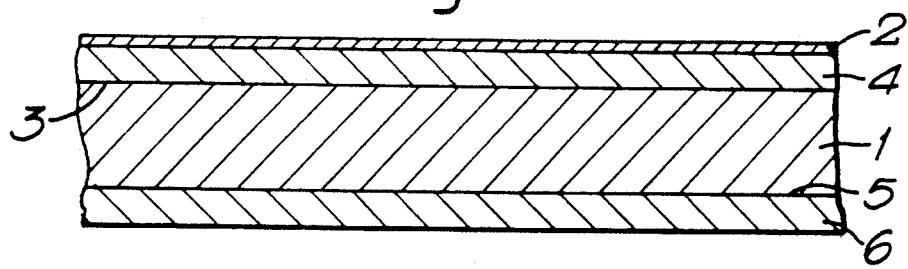
FIG. 2 is a similar schematic elevation of a polymeric film having respectively a metallic and an adherent surface layer.

The film of FIG. 2 additionally comprises a layer (6) of, for example, an adherent layer bonded to the remote substrate surface (5).

Figure 3:
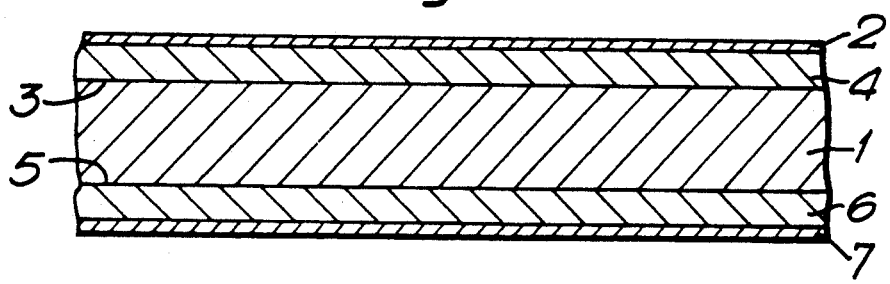
FIG. 3 is a similar schematic elevation of a polymeric film metallised on both opposed surfaces.

The film of FIG. 3 further comprises a second metallic layer (7) bonded to a layer (6) of an adherent layer, layer (6) in turn being directly bonded to substrate surface (5).

The invention is further illustrated by reference to the following Examples.

EXAMPLE 1

A polyethylene terephthalate film was melt extruded, cast onto a cooled rotating drum and stretched in the direction of extrusion to approximately 3 times its original dimensions. The cooled stretched film was then coated with an aqueous composition containing the following ingredients:

| | |
|---|---|
| Methyl methacrylate/butyl acrylate/styrene/ (acrylic acid or methacrylic acid) polymer of approximately 35/37/12/16 mole %. | 60 g |
| Hexamethoxy methyl melamine (commercially available as 'Cymel' 300) | 12 g |
| Ammonium nitrate | 2 g |
| Synperonic NP 10 (an alkyl nonylphenol ethoxylated surfactant supplied by Imperial Chemical Industries) | 3 g |
| Water added to give a coating composition of total volume 2 liters. | |

The polyethylene terephthalate film was coated on one side only.

The coated film was passed into a stenter oven, where the film was dried and stretched in the sideways direction to approximately 3 times its original dimensions. The biaxially stretched coated film was heat set at a temperature of about 200° C. by conventional means. Final film thickness was 0.03-0.05 μm with a coat weight of approximately 0.3 to 0.5 mgdm$^{-2}$.

The coated side of the film was metallised by a conventional evaporative method to give a layer of aluminium of approximately 0.05 μm. The metallised film was subjected to a standard peel strength test in order to determine the failure resistance of the laminate. Samples of the metallised film were heat sealed ie the metal layer was sealed to a dry adhesive film tape. The seal was achieved using a 'Sentinel' heat-sealer operating at a jaw temperature of 105° C., dwell time of 10 seconds and jaw pressure of 50 psi (3.45×10$^5$ Nm$^{-2}$). This produced a seal 25 mm wide across the sample.

Peel specimens were prepared by cutting 25 mm strips at right angles to the seal, giving a sealed area of 25 mm by 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm min$^{-1}$. The peel load was recorded for each specimen and the amount of aluminium transferred to the dry adhesive tape was visually assessed in each case.

The results of these "dry" peel strength tests are given in Table 1.

The above procedure was repeated except that this time the sample was moistened with water along the metal layer—adhesive tape seal immediately before performing the peel strength tests. The results of these "wet" peel strength tests are given in Table 1.

EXAMPLE 2

The procedure of Example 1 was repeated except that this time the composition of methyl methacrylate/butyl acrylate/styrene/(acrylic acid or methacrylic acid) polymer used was approximately 34/42/11/13 mole %. "Dry" and "wet" peel strength tests were performed, and the results are given in Table 1.

EXAMPLE 3

This is a comparative example not according to the invention. The procedure of Example 1 was repeated except that the polymeric coating stage was omitted. The uncoated polyethylene terephthalate film was metallised as described in Example 1, and the results of "dry" peel strength tests are given in Table 1.

EXAMPLE 4

This is a comparative example not according to the invention. The procedure of Example 1 was repeated except that the polymer used was methyl methacrylate/ethyl acrylate/(acrylic acid or methacrylic acid) of approximate molar ratio of 47/47/6. "Dry" and "wet" peel strength tests were performed, and the results are given in Table 1.

TABLE 1

| Example No | Peel Strength g/25 mm (Nm$^{-1}$) | Aluminium removed % |
|---|---|---|
| 1 "DRY"* | 730 (286.5) | <5% |
| "WET"* | 720 (282.6) | ≈5% |
| 2 "DRY"* | 550 (215.9) | <5% |
| "WET"* | 540 (212.0) | <5% |
| 3 "DRY" (Comparative) | 200 (78.5) | ≈90% |
| 4 "DRY"* | 850 (333.6) | <5% |
| "WET" (Comparative) | 50 (19.6) | ≈90% |

*Laminate failed due to adhesive tape film breakage. There was no delamination between the metal layer and polymeric coating.

EXAMPLE 5

A polyethylene naphthalate film was melt extruded, cast onto a cooled rotating drum and stretched in both the direction of extrusion and the sideways direction to approximately 3 times its original dimensions. The biaxially stretched film was heat set at a temperature of about 225° C. by conventional means. Samples of biaxially drawn polyethylene naphthalate film were coated on one side only, using a No 'O' Meyer bar, with an aqueous composition containing the following ingredients:

| | |
|---|---|
| Methyl methacrylate/butyl acrylate/styrene/ (acrylic acid or methacrylic acid) polymer of approximately 35/37/12/16 mole %. | 60 g |
| Hexamethoxy methyl melamine (commercially available as 'Cymel' 300) | 10 g |
| Ammonium nitrate | 1 g |
| Synperonic NP 10 (an alkyl nonylphenol ethoxylated surfactant supplied by Imperial Chemical Industries) | 10 g |
| Water added to give a coating composition of total volume 2 liters. | |

The coated film was dried in an oven at 120° C. for 1 minute. The dry coat weight of the film was approximately 0.3 to 0.5 mgdm$^{-2}$.

The coated side of the film was metallised as described in Example 1. "Dry" and "wet" peel strength tests were performed as described in Example 1, and the results are given in Table 2.

EXAMPLE 6

This is a comparative example not according to the invention. The procedure of Example 5 was repeated except that the polymeric coating stage was omitted. The uncoated polyethylene naphthalate film was metallised as described in Example 1, and the results of "dry" peel strength tests are given in Table 2.

TABLE 2

| Example No | Peel Strength g/25 mm (Nm$^{-1}$) | Aluminium removed % |
|---|---|---|
| 5 "DRY"* | 1437 (563.9) | <5% |
| "WET"* | 1199 (470.5) | <5% |
| 6 "DRY" | 193 (75.7) | >90% |

*Laminate failed due to adhesive tape film breakage. There was no delamination between the metal layer and polymeric coating.

The superior peel strength of, and resistance to removal of aluminium from, metallised films of the present invention under both dry and humid conditions is evident from the above results.

We claim:

1. A metallised film suitable for use as a packaging film and comprising a substrate layer of a synthetic polymeric material having on at least one surface thereof an adherent layer and a metallic layer on the surface of the at least one adherent layer remote from the substrate, characterised in that the adherent layer comprises an acrylic and/or methacrylic polymer comprising at least one monomer containing a free carboxylic group, wherein the carboxylic group content of the polymer is greater than 6 mole %, said metallic layer providing a barrier to visible and ultra-violet light and said adherent layer providing improved adhesion between said metallic layer and substrate layer under humid conditions.

2. A metallised film as claimed in claim 1 wherein the carboxylic group content of the polymer is less than 35 mole %.

3. A metallised film as claimed in either of claims 1 and 2 wherein the at least one monomer is selected from acrylic acid, methacrylic acid and/or a derivative of acrylic acid and/or methacrylic acid.

4. A metallised film as claimed in claim 1 wherein the adherent layer comprises a polymer comprising methyl methacrylate/butyl acrylate/(acrylic acid and/or methacrylic acid).

5. A metallised film as claimed in claim 1 wherein the adherent layer comprises a polymer comprising 30 to 40 mole % of methyl methacrylate/40 to 50 mole % of butyl acrylate/5 to 15 mole % of styrene/10 to 20 mole % of (acrylic acid and/or methacrylic acid).

6. A metallised film as claimed in claim 1 wherein the adherent layer is at least partially cross-linked.

7. A metallised film as claimed in claim 1 wherein the adherent layer contains a particulate filler having a particle size less than 0.1 μm, and being present in an amount up to 50% by weight of the adherent layer.

8. A metallised film as claimed in claim 1 wherein the substrate comprises a biaxially oriented film of polyethylene terephthalate.

9. A method of producing a metallised film suitable for use as a packaging film and by forming a substrate layer of a synthetic polymeric material, applying to at least one surface thereof an adherent layer, and depositing a metallic layer on the surface of the at least one adherent layer remote from the substrate, characterised in that the adherent layer comprises an acrylic and/or methacrylic polymer comprising at least one monomer containing a free carboxylic group, wherein the carboxylic group content of the polymer is greater than 6 mole %, the metallic layer providing a barrier to visible and ultra-violet light and said adherent layer providing improved adhesion between said metallic layer and substrate layer under humid conditions.

10. A method as claimed in claim 9 wherein the substrate is a polyethylene terephthalate film which is biaxially oriented by sequential stretching in two mutually perpendicular directions, the adherent coating medium being applied to the film substrate between the two stages (longitudinal and transverse) of the biaxial stretching.

* * * * *